United States Patent [19]
Sims

[11] Patent Number: 5,614,828
[45] Date of Patent: Mar. 25, 1997

[54] DISTRIBUTORLESS IGNITION TEST DEVICE INCLUDING INPUT PORT CONNECTED DIRECTLY TO THE ENGINE BLOCK ESTABLISHING ELECTRICAL CONTACT THEREWITH

[75] Inventor: Benny L. Sims, Windsor, Calif.

[73] Assignee: California State Automobile Association, San Francisco, Calif.

[21] Appl. No.: 233,510

[22] Filed: Apr. 26, 1994

[51] Int. Cl.$^6$ .................................................. F02P 17/12
[52] U.S. Cl. ............................................................ 324/402
[58] Field of Search ................................ 324/379, 380, 324/378, 391, 393, 394, 402

[56]  References Cited

U.S. PATENT DOCUMENTS

| | | | |
|---|---|---|---|
| 3,811,089 | 5/1974 | Strzelewicz | 324/402 |
| 3,942,113 | 3/1976 | Wilson | 324/402 |
| 3,990,303 | 11/1976 | Reeves . | |
| 4,008,430 | 2/1977 | Blum . | |
| 4,186,337 | 1/1980 | Volk et al. . | |
| 4,644,284 | 2/1987 | Friedline et al. . | |
| 4,686,953 | 8/1987 | Brown . | |
| 4,758,791 | 7/1988 | Tedeschi et al. . | |
| 4,847,563 | 7/1989 | Sniegowski et al. . | |
| 4,937,527 | 6/1990 | Sniegowski et al. . | |
| 5,004,984 | 4/1991 | Becker et al. | 324/402 |
| 5,043,659 | 8/1991 | Lowmiller et al. | 324/402 |
| 5,132,625 | 7/1992 | Shaland | 324/402 |
| 5,218,302 | 6/1993 | Loewe et al. | 324/402 |
| 5,237,278 | 8/1993 | Bumen | 324/402 |

OTHER PUBLICATIONS

*Automotive Engine Performance, Tuneup, Testing, and Service,* Second Edition, vol. I, Ken Layne, Regents/Prentice Hall, pp. 263–275, 1986.

Ford Motorcraft *Shop Tips, Advances in Timing and Fuel Injection,* Issue Number 10, 1989, pp. 1–14.

*Distributorless Ignition Service,* Wayne Eiffes, Contributing Editor, Motor/age, Jul. 1990, pp. 16–17, 20, 22, 24.

General Motors Corporation 1984–1988 *Distributor–Less Ignition Systems Operation and Diagnostic Procedures,* 1989.

General Motors Corporation *GM Distributorless Ignition Systems,* 1989.

*Automotive Engine Performance,* Second Edition, vol. II, Ken Layne, Regents/Prentice Hall, pp. 263–266, 1989.

*Primary Examiner*—Sandra L. O'Shea
*Assistant Examiner*—Roger Phillips
*Attorney, Agent, or Firm*—Coudert Brothers

[57]  ABSTRACT

An adapter that enables the testing of secondary ignition signals of vehicle engines equipped with wireless secondary ignition systems is disclosed. The adapter detects secondary ignition voltage pulses generated by such an ignition system. It includes an input port coupled to an engine ground for receiving an electrical signal comprising a secondary ignition signal; an output port; and a filter coupled between said input port and said output port, said filter passing an electrical representation of said secondary ignition signal to said output port. In a preferred embodiment, the adapter includes a preamplifier coupled between the input port and the filter to amplify the electrical signal and an amplifier coupled between the filter and the output port to amplify the secondary ignition signal. The output port preferably is coupled to an oscilloscope allowing a technician to visually inspect the secondary ignition system waveform.

8 Claims, 3 Drawing Sheets

DISTRIBUTORLESS IGNITION TEST DEVICE INCLUDING INPUT PORT CONNECTED DIRECTLY TO THE ENGINE BLOCK ESTABLISHING ELECTRICAL CONTACT THEREWITH

FIELD OF THE INVENTION

The present invention relates to motor vehicle ignition testing systems and, more particularly, to devices for testing wireless, distributorless ignition systems.

BACKGROUND OF THE INVENTION

Historically, most ignition systems for internal combustion engines have used a distributor. Distributor type ignition systems generally consist of a single ignition coil to generate high voltage electrical energy and a distributor to mechanically distribute this high voltage electrical energy to the spark plugs within each engine cylinder. As is well known, delivery of the electrical energy is timed so that the spark plugs ignite a fuel mixture charge in each cylinder at or near the beginning of each cylinder compression stroke. The ignition coil used in distributor ignition systems typically has a single primary winding and a single secondary winding, where voltage pulses across the primary winding induce high voltage pulses in the secondary winding. The distributor typically distributes the high voltage pulses using a rotor which rotates to sequentially direct the voltage pulses from the secondary winding to peripherally distributed electrodes in a distributor cap which are, in turn, connected to spark plug wires attached to individual spark plugs.

Recently, distributorless ignition systems have become common. In contrast to distributor type systems, distributorless ignition systems do not have a mechanical distributor and typically use one coil for every two cylinders to generate the high voltage pulses. In most distributorless systems, each end of an ignition coil secondary winding is connected to a spark plug, in contrast to conventional distributor ignition systems in which one end of the coil's secondary winding is attached to the engine ground. The two spark plugs attached to a given coil are in companion cylinders (cylinders that are at top dead center at the exact same time). To cause the spark plugs to fire while the cylinders are at top dead center, a distributorless ignition system electronically senses top dead center and directs a high voltage surge to each coil with no moving parts. One cylinder (referred to as the "event cylinder") will be on the compression stroke at the time of a given firing, while the other cylinder (referred to as the "waste cylinder") is on the exhaust stroke. In a small percentage of distributorless ignition systems, a separate coil is used for each cylinder, one end of each coil being coupled to a cylinder and the other end being coupled to ground. This type of system operates in a manner similar to the more common distributorless ignition systems having one coil for every two cylinders, except each spark plug is fired separately. Distributorless ignition systems generally offer many advantages over conventional mechanical distributor systems, including the advantages of fewer moving parts, more compact mounting, and no unnecessary mechanical load on the engine. Distributorless ignition systems are now well known in the art.

Distributorless ignition systems commonly include an electronic control module which is located in the passenger compartment or under the hood. The control module causes sequential energization of the ignition coils, which are located in one or more housings referred to as coil packs. The coil pack or packs are mounted in close proximity to the engine, and a cosmetic aluminum cover commonly covers all or a portion of the coil packs. More specifically, using switching transistors, the control module controls the coupling of voltage to the primary winding of each ignition coil, each coil generating secondary voltage pulses in response thereto, causing the spark plug to fire.

Many modern distributorless ignition systems, such as the General Motors Quad 4 system, also eliminate the need for secondary spark plug wires. The components of such a system, including the coil packs, are mounted on top of the cylinder head. In place of spark plug wires, such wireless distributorless ignition systems use a fiat wire circuit which is located in the housing to distribute the secondary voltage to the spark plugs. This reduces the capacitance of the secondary circuit, allowing the high voltage pulse generated by the secondary winding of the coil to have a faster rise time. This enables the production of nearly twice as much secondary current as in some mechanical distributor systems.

Because two spark plugs are attached to each ignition coil, the spark plugs fire in a slightly different manner from spark plugs controlled by conventional distributor ignition systems. Electrical current in the secondary circuit passes from the ignition coil through the first spark plug, creating a spark from the spark plug's inner electrode to its outer electrode, as in conventional ignition systems. However, the electrical current then passes through the engine block/ground to the outer electrode of the second spark plug, arcing across to the center electrode (i.e. arcing in the reverse direction from conventional systems) and back to the ignition coil to complete the circuit. Put simply, one spark plug fires forward and the other fires backward.

Due to the differences between distributorless ignition systems and conventional, distributor ignition systems, it is difficult to test a distributorless ignition system using conventional engine analyzer equipment. For instance, there is no common point from which secondary or high voltage waveform signals for all cylinders can be coupled to an engine analyzer for analysis. In addition, there is no common primary circuit from which a primary or low voltage signal can be detected for all cylinders. Finally, spark plug wires, which historically provided convenient locations at which to detect electrical signals, are not present in many distributorless ignition systems. The current industry standard test procedure for testing distributorless ignition systems calls for the technicians to disassemble the ignition system and install spark plug wires. This approach is time consuming, and is also potentially inaccurate due to the installation of spark plug wires on a previously wireless system.

Accordingly, there is a need for a means of testing distributorless ignition systems utilizing conventional automotive testing equipment that can be used on systems having no spark plug wires without requiring that the ignition system be disassembled or spark plug wires installed.

SUMMARY OF THE INVENTION

Broadly stated, the present invention encompasses an adapter that enables the testing of secondary ignition signals of vehicle engines equipped with wireless secondary ignition systems. The adapter detects secondary ignition voltage pulses generated by such an ignition system. It includes an input port coupled to an engine ground for receiving an electrical signal comprising a secondary ignition signal; an output port; and a filter coupled between said input port and said output port, said filter passing an electrical representation of said secondary ignition signal to said output port. In a preferred embodiment, the adapter includes a preamplifier coupled between the input port and the filter to amplify the electrical signal and an amplifier coupled between the filter and the output port to amplify the secondary ignition signal. The output port preferably is coupled to an oscilloscope allowing a technician to visually inspect the secondary ignition system waveform.

One object of the present invention is, therefore, to provide a means for testing wireless distributorless ignitions systems.

Another object of the present invention is to provide a means for testing wireless distributorless ignition systems without disassembling the ignition system or installing spark plug wires.

Still another object of the present invention is to provide a means for testing wireless distributorless ignition systems using conventional engine analyzer equipment, such as a conventional engine analyzer oscilloscope.

Yet another object of the present invention is to provide a means for analyzing the secondary ignition signal of an ignition system by sensing an electrical signal from the engine ground.

A further object of the present invention is to allow for analysis of the waveform, and abnormalities in the waveform, of a secondary ignition signal by technicians of ordinary skill using an electrical signal detected from the engine ground.

These and other objects of the present invention will become apparent to those skilled in the art from the following detailed description of the invention and preferred embodiments, the accompanying drawings, and the appended claims.

DETAILED DESCRIPTION OF THE INVENTION AND PREFERRED EMBODIMENTS

Figure 1:
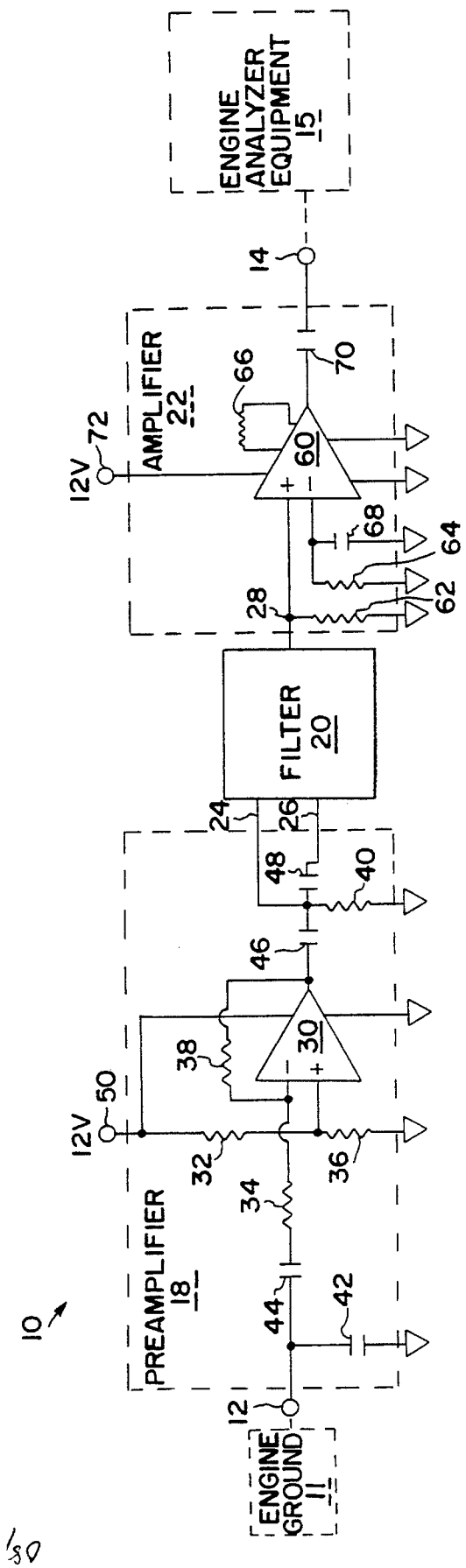
FIG. 1 is a combined block and circuit diagram illustrating one embodiment of an adapter according to the present invention.

A circuit diagram of an adapter according to the present invention is shown at 10 in FIG. 1. Adapter 10 can be used to connect a distributorless ignition system to a conventional engine analyzer to analyze secondary ignition signals generated by the system (i.e., the electrical signals generated in the secondary circuits of an engine's ignition system). The AC components of the secondary ignition signals may be viewed on a conventional engine analyzer oscilloscope.

Adapter 10 is particularly useful for testing wireless ignition systems. For example, it can be used to test the ignition system of motor vehicles equipped with General Motors Quad-4 system, and other wireless ignition equipped cars, such as the Nissan 300ZX, Pulsar, and many Saab vehicles.

Adapter 10 receives an electrical signal at an input port 12, which is coupled to a test point at the ground or negative side of the vehicle's electrical system shown in FIG. 1 as block 11. The inventor has discovered that metal surrounding the ignition coils contains the secondary signal at a very low voltage value mixed in with electromagnetic interference or noise from other vehicle electrical systems and has recognized that the signals of interest can be found within a finite frequency range or ranges within this noise.

Adapter 10 processes the electrical signal received at input port 12 to produce a representation of the secondary ignition signal at output port 14 that can be viewed using a conventional automotive engine analyzer oscilloscope, shown as block 15. More specifically, the secondary ignition signal received at input port 12 commonly will include undesired noise signals from many sources, such as the AM/FM radio and the engine's alternator, fuel pump, and cooling fans. Adapter 10 filters out these undesired signals and their harmonics, and amplifies the secondary ignition signal. This filtering process preferably is performed using multiple precision (medical grade) band pass filters with high quality, low distortion audio range amplifiers. After the secondary ignition signal is filtered and amplified, it is sent to the engine analyzer oscilloscope for viewing and analysis by a technician.

Input port 12 is preferably coupled to a test point as close as possible to the ignition coil packs. For example, in many systems, the signal may be detected using a conventional engine analyzer clamp attached to the cosmetic aluminum cover that generally covers the coil pack. The clamp should also be connected as far as possible from the engine's alternator, a major source of engine noise, to avoid drowning out the signals of interest. The clamp used to detect the signal is preferably a conventional Muller clamp, although other conventional clamps may be used. In general, the clamp preferably is constructed of a good conductor such as copper and preferably has a strong spring allowing it to clamp tightly to the test point. This allows for good electrical connection despite corrosion or other build-up of non-conductive material on the test point. The precise test point will, of course, vary from vehicle to vehicle.

As seen in FIG. 1, adapter 10 preferably comprises a preamplifier 18, a filter 20, and an amplifier 22. Preamplifier 18 amplifies the electrical signal received at input port 12 to produce amplified electrical signals at nodes 24 and 26. Filter 20 filters the amplified electrical signals at nodes 24 and 26 to filter out noise and produce a representation of the secondary ignition signal at node 28. Amplifier 22 amplifies the secondary ignition signal received at node 28 to produce an output signal comprising an amplified version of the secondary ignition signal at output port 14. This output signal is then coupled to engine analyzer 15.

Preamplifier 18 includes an operational amplifier 30, resistors 32–40, and capacitors 42–48. Capacitor 42 is coupled between input port 12 and the ground for adapter 10. Capacitor 44 and resistor 34 are coupled in series between input port 12 and the inverting input of operational amplifier 30. Resistors 32 and 36 are a voltage divider, being coupled in series between a stabilized 12 V power supply at a terminal 50 and the ground for adapter 10. This divider provides a reference voltage for the non-inverting input of operational amplifier 30. Resistor 38 is coupled as a feedback loop between the inverting input and the output of operational amplifier 30. The $V_+$ and $V_-$ terminals of operational amplifier 30 are coupled to terminal 50 and ground, respectively. The output of operational amplifier 30 is coupled through an AC coupling capacitor 46 to node 24. A capacitor 48 is coupled between node 24 and node 26, and resistor 40 is coupled between node 24 and ground. The elements of preamplifier 18 preferably have the following values: capacitor 42, 0.007 µf; capacitor 44, 1.0 µf; resistor 34, 1 kΩ; resistors 32 and 36, 10 kΩ; resistor 38, 100 kΩ; capacitor 46, 10 µf; capacitor 48, 0.1 µf; and resistor 40, 10 MΩ. Operational amplifier 30 is preferably a conventional model 741 op-amp.

In operation, the AC component of the electrical signal received at input port 12 is filtered by capacitor 42 and coupled through capacitor 44 and resistor 34 to the inverting input of operational amplifier 30. As the $V_+$ and $V_-$ terminals of operational amplifier 30 are coupled to 12 V and ground, respectively, the voltage divider comprising resistors 32 and 36 is used to set the non-inverting input at approximately a DC voltage of 6 V to allow for adequate amplification. Resistor 38 provides conventional negative feedback for amplifier 30. Thus, the AC component of the electrical signal received at input port 12 is amplified by operational amplifier 30 to produce an amplified electrical signal. Resistors 34 and 38 determine the factor by which the signal is amplified. The AC component of the amplified electrical signal passes through capacitor 46 to node 24, and passes through capacitor 46 and capacitor 48 to node 26. Any DC component of the signal is coupled through resistor 40 to ground. Thus, an amplified version of the AC component of the electrical signal received at input port 12 is produced at both node 24 and node 26. Resistor 10 also trims the amplitude of the AC signal, with higher value resistors tending to reduce the amplitude of higher frequency signals and lower value resistors tending to reduce the amplitude of lower frequency signals. It will be recognized by those skilled in the art, therefore, that the value of resistor 40 can be adjusted to scale the relative amplitudes of the high and low frequency AC components of the signals produced at nodes 24 and 26.

Filter 20 filters the amplified electrical signals received at nodes 24 and 26. Filter 20 is a bandpass filter designed so that the secondary ignition signal passes through to node 28 and noise signals are substantially prevented from passing through it. This can be accomplished because, as noted above, the secondary ignition signal is substantially confined to a finite frequency range or ranges. Filter 20 is described in more detail in connection with FIG. 2.

Amplifier 22 amplifies the representation of the secondary ignition signal received at node 28 to produce an output signal of sufficient amplitude at output port 14 to be suitable for reception by, and viewing on the engine analyzer's oscilloscope. Amplifier 22 comprises an operational amplifier 60, resistors 62–66, and capacitors 68 and 70. Operational amplifier 60 is preferably a low-power instrumentation amplifier, such as Analog Devices AMP-04. The remaining elements of amplifier 22 preferably have the following values: resistor 62 and 64, 10 MΩ; resistor 66, 1 kΩ; capacitor 68, 0.1 µf; and capacitor 70, 10 µf.

The above-described elements are coupled to one another in the following manner. Resistor 62 is coupled between node 28 and ground, providing a DC path to ground. It will be recognized by those skilled in the art that resistor 62 will also provide feedback through ground to preamplifier 18. Node 28 is coupled to the non-inverting input of operational amplifier 60. Resistor 64 and capacitor 68 are coupled in parallel between the inverting input of operational amplifier 60 and ground, and serve to reduce or filter noise or EMI. The $V_+$ and $V_-$ terminals of operational amplifier 60 are coupled to 12 V and ground, respectively. Resistor 66 is a gain setting resistor, preferably coupled between input terminals 1 and 8 of Analog Devices AMP-04, and the reference terminal 5 of the AMP-04 is preferably coupled to ground. The output terminal of operational amplifier 60 is coupled through capacitor 70 to output port 14. Terminal 72 receives power from a stabilized 12 V power supply, and may be coupled to terminal 50.

In operation, amplifier 22 amplifies the secondary ignition signal received at node 28. In a conventional manner, the gain is set using resistor 66. Amplifier 22 thus produces an amplified version of the secondary ignition signal at output port 14.

Figure 2:
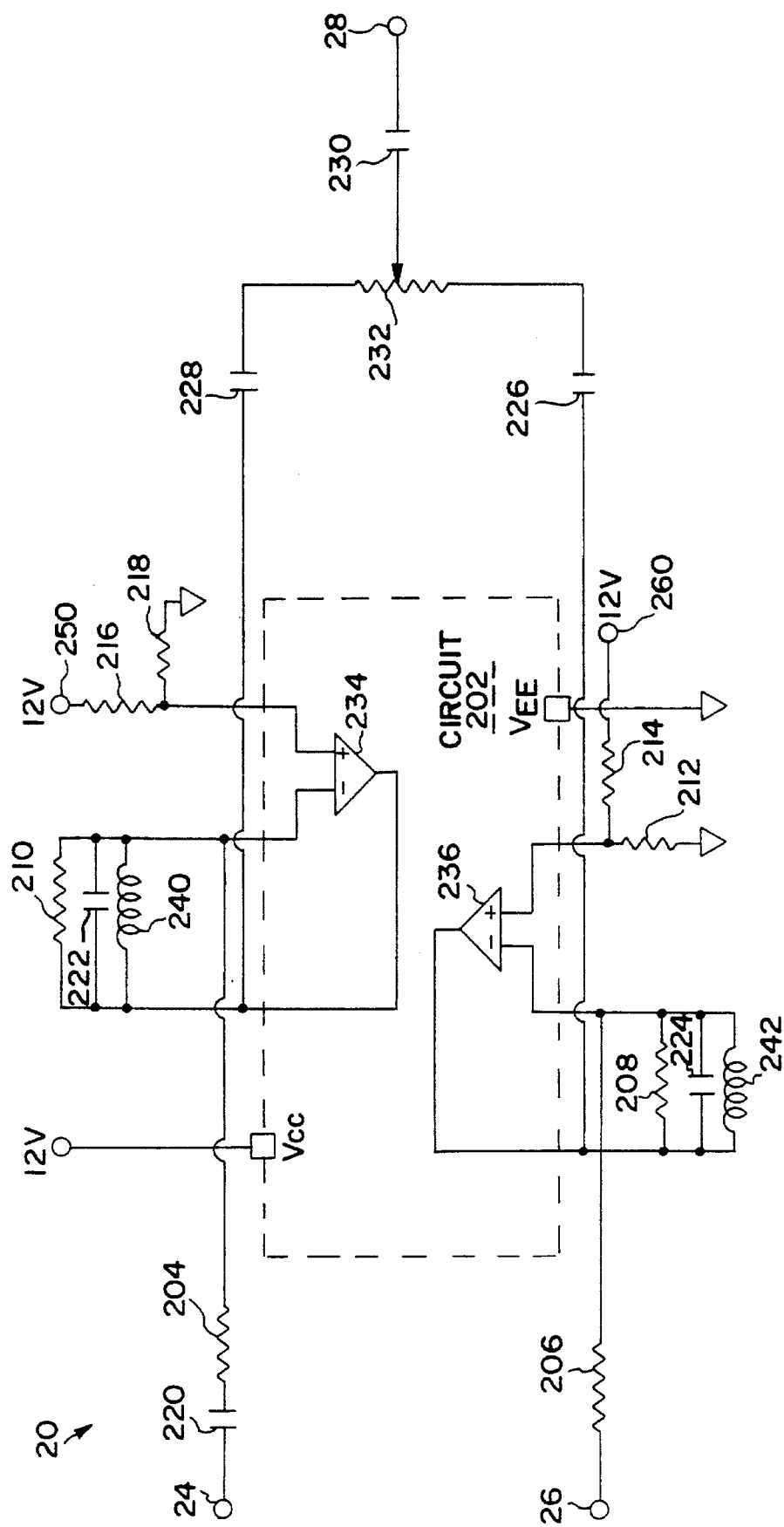
FIG. 2 is a circuit diagram illustrating one embodiment of a filter for use in an adapter according to the present invention.

Referring now to FIG. 2, filter 20 is described in more detail. Filter 20 comprises a dual operational amplifier circuit 202, resistors 204–218, capacitors 220–230, inductors 240 and 242 and a potentiometer 232. Dual amplifier circuit 202 comprises two operational amplifiers, 234 and 236, and is preferably a Motorola MC1458 internally compensated, high performance dual operational amplifier integrated circuit. The supply rail voltages for operational amplifiers 234 and 236 are provided at the $V_{cc}$ and $V_{ee}$ terminals of circuit 202. The elements of filter 20 preferably have the following values: resistors 212–216, 10 kΩ; resistor 218, 5 kΩ; resistors 204 and 206, 1 kΩ; resistor 208, 68Ω; resistor 210 1.2 kΩ; capacitors 220 and 226–230, 0.1 µf; capacitor 222, 0.27 µf; capacitor 224, 0.33 µf; inductor 240, 560 µH; inductor 242, 4.72 mH; and potentiometer 232, resistance value of 20 kΩ.

In operation, the electrical signal from node 24 is preferably filtered through a first band pass filter, which includes operational amplifier 234, to provide a filtered electrical signal to the first terminal of potentiometer 232. The electrical signal from node 26 is preferably filtered through a second band pass filter, which includes operational amplifier 236, to provide a filtered electrical signal to the other terminal of potentiometer 232. The output terminal of potentiometer 232 is coupled to node 28 via an AC coupling capacitor 230. These filters pass frequency bands corresponding to the frequency ranges of the secondary ignition signal, which are described in more detail in connection with FIG. 3. It will be appreciated by those skilled in the art that the present invention encompasses adapters having any selected number of band pass filters. Two band pass filters, as disclosed herein, are preferred.

More specific aspects of the operation of filter 20 are as follows. A series combination of AC coupling capacitor 220 and resistor 204 is coupled between node 24 and the inverting input of operational amplifier 234. A voltage divider comprising resistors 216 and 218 is coupled between a stabilized 12 V power supply at terminal 250 and ground, to produce a DC reference voltage at the non-inverting input of operational amplifier 234. A feedback circuit from the output to the inverting input of operational amplifier 234 comprises a parallel combination of resistor 210, capacitor 222, and inductor 240, with the result that operational amplifier 234 acts as a bandpass filter, passing a signal frequency band that is dependent in a conventional fashion on the values of resistor 210, capacitor 222 and inductor 240. The output of operational amplifier 234 is coupled through AC coupling capacitor 228 to potentiometer 232.

Similarly, resistor 206 is coupled between node 26 and the inverting input of operational amplifier 236. No capacitor is coupled between node 26 and operational amplifier 236 because capacitor 48, described above, serves as the AC coupling capacitor that is analogous in function to AC coupling capacitor 220. A voltage divider comprising resistors 212 and 214 is coupled between a stabilized 12 V power supply at terminal 260 and ground, to produce a DC reference voltage at the non-inverting input of operational amplifier 236. A feedback circuit from the output to the inverting input of operational amplifier 236 comprises a parallel combination of resistor 208, capacitor 224, and inductor 242, with the result that operational amplifier 236 acts as a bandpass filter, passing a signal frequency band that is dependent, again in a conventional fashion, on the values of resistor 208, capacitor 224 and inductor 242. The output of operational amplifier 236 is coupled through AC coupling capacitor 226 to potentiometer 232.

The output of potentiometer 232 is coupled through capacitor 230 to node 28 which, as noted above, preferably is coupled via an amplifier 22 to an engine analyzer oscilloscope. In a conventional manner, the values of elements in the feedback loops for operational amplifiers 234 and 236 are chosen to pass the signal frequency bands corresponding to the frequency ranges of the secondary ignition signal being tested. In a conventional manner, the signal frequency bands that are filtered by these filters are combined in the desired proportion using potentiometer 232.

Figure 3:
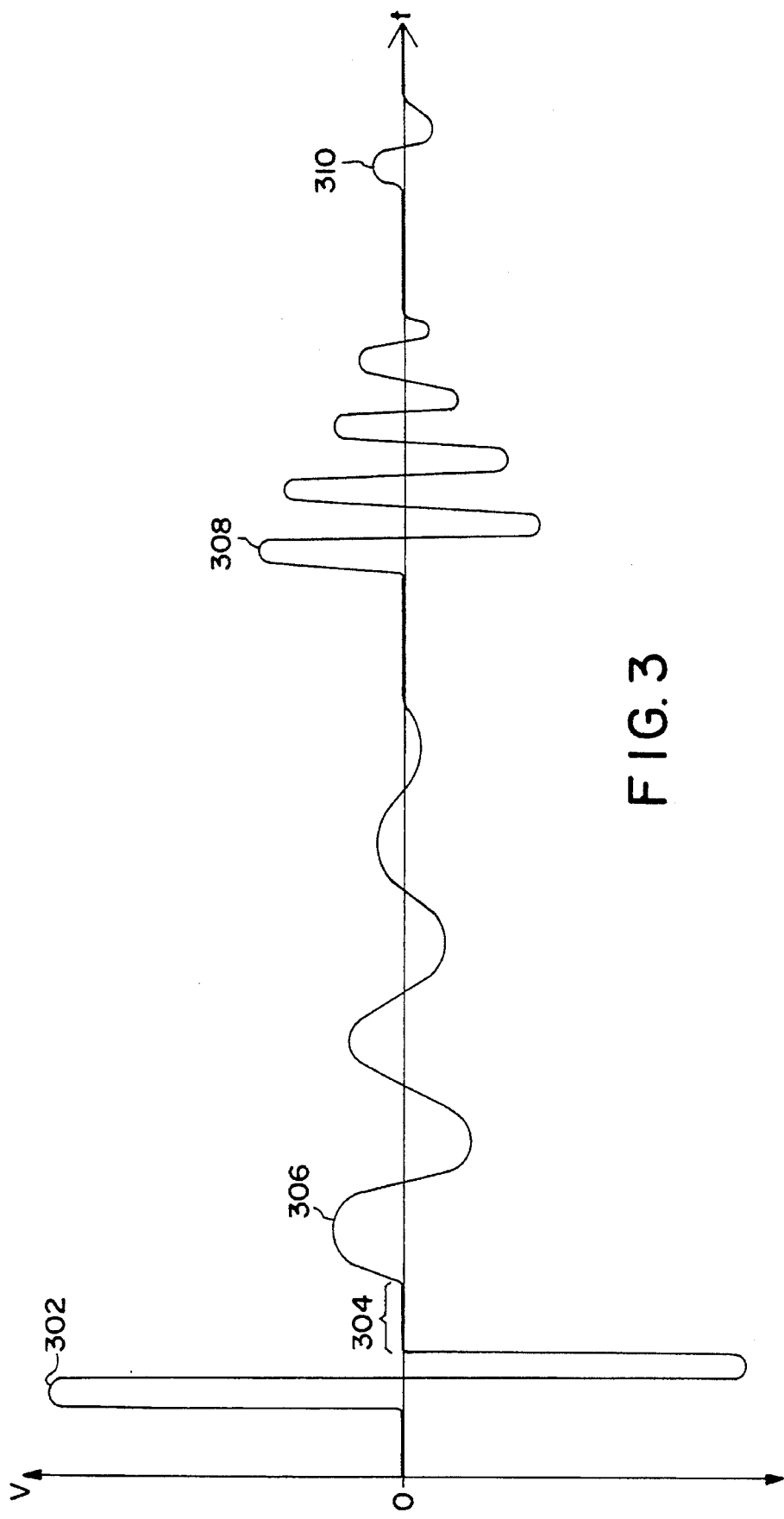
FIG. 3 is a timing diagram illustrating an exemplary voltage representation of a secondary ignition signal generated by an adapter according to the present invention coupled to the engine's ground.

Referring now to FIG. 3, a voltage waveform corresponding to an exemplary secondary ignition signal will be described. The waveform shown in FIG. 3 represents the AC component of one firing event for a given coil, as seen on a conventional engine analyzer oscilloscope with the analyzer coupled through adapter 10 to the engine ground. A technician of ordinary skill in the art is capable of analyzing this type of waveform for abnormalities indicating problems with the ignition system such as worn spark plugs, bad connections, short-circuited spark plugs or wires, or faulty coils.

As described above, since a given coil is connected to two spark plugs, both spark plugs will fire as a result of the signal shown in FIG. 3, one in a normal polarity and the other in an inverted polarity. The firing event frequency will generally range from 425 Hz to 3850 Hz, depending on the number of engine cylinders and the engine R.P.M. The entire waveform shown in FIG. 3 commonly occurs in a time period of about 5 milliseconds.

A firing spike 302, shown in FIG. 3, defines the beginning of each firing event. The frequency of spike 302 is approximately 14.5 KHz in many conventional, distributorless ignition systems.

Firing spike 302 is the voltage pulse from an ignition coil secondary winding that causes the affected spark plugs to fire. Following the spike, spark plug arcing is maintained across the spark plug electrodes for a time period 304 ranging from 0.9 milliseconds to 2.2 milliseconds, during which the AC component of the secondary ignition signal detected will be approximately zero volts.

The firing of the spark plug is generally followed by several voltage oscillations caused by ringing during the discharge of the voltage in the coil. Discharge coil oscillations 306 generally occur at a frequency of 4.01 KHz in common distributorless ignition systems. Subsequently, a coil recharge oscillation 308 occurs at a frequency of 14.5 KHz, as the primary winding recharges. Finally, most common current control mechanisms generally cause a current control effect 310, at low rpm only.

The signals described above occur substantially within frequency bands at approximately 4.01 KHz and approximately 14.5 KHz. Filter 20, therefore, is set to pass signals in those frequency bands and to reject as much noise as possible within other frequency bands.

While the present invention has been described in connection with illustrated embodiments, the present invention encompasses alterations, modifications, and adaptations that may be made based on the present disclosure. While the present invention has been described in connection with preferred embodiments, it will be understood that the present invention is not limited to the disclosed embodiments.

What is claimed is:

1. An adapter for testing a wireless secondary ignition system of an internal combustion engine, comprising:

an input port mechanically connected to said ground of the engine, said mechanical connection establishing a direct electrical conducting path between said input port and said ground for receiving an electrical signal, said electrical signal including a secondary ignition signal;

an output port;

a filter, coupled between said input port and said output port, for filtering out signals other than said secondary ignition signal from said electrical signal and for coupling said secondary ignition signal to said output port; and amplifier means coupled to said filter for amplifying said secondary ignition signal.

2. The adapter of claim 1, wherein said amplifier means comprises a preamplifier coupled between said input port and said filter for amplifying said electrical signal.

3. The adapter of claim 1, wherein said amplifier means comprises an amplifier coupled between said filter and said output port for amplifying said secondary ignition signal.

4. The adapter of claim 1, wherein said filter comprises a band pass filter tuned to pass signals of a frequency matching a frequency of said secondary ignition signal.

5. The adapter of claim 1, wherein said filter comprises two band pass filters, each of said band pass filters being tuned to pass signals of a frequency matching a frequency of said secondary ignition signal.

6. The adapter of claim 1, wherein said output port is coupled to an engine analyzer.

7. The adapter of claim 1, wherein said secondary ignition signal comprises signals in two frequency ranges, and wherein said filter passes signals within said two frequency ranges and substantially rejects signals within other frequency ranges.

8. An adapter for testing a wireless ignition system for an internal combustion engine, comprising:

an input port mechanically connected to said ground of the engine, said mechanical connection establishing a direct electrical conducting path between said input port and said ground for receiving an electrical signal, said electrical signal including a secondary ignition signal;

an output port;

a preamplifier coupled to said input port for amplifying said electrical signal to produce an amplified electrical signal that is substantially proportional to said electrical signal;

a filter coupled to said preamplifier for filtering said amplified electrical signal such that said secondary ignition signal passes through said filter; and an amplifier coupled between said filter and said output port for amplifying said secondary ignition signal.

\* \* \* \* \*